United States Patent [19]
Douse et al.

[11] Patent Number: 5,446,695
[45] Date of Patent: Aug. 29, 1995

[54] MEMORY DEVICE WITH PROGRAMMABLE SELF-REFRESHING AND TESTING METHODS THEREFORE

[75] Inventors: David E. Douse; Wayne F. Ellis, both of Jericho; Erik L. Hedberg, Essex Junction, all of Vt.

[73] Assignee: International Business Machines Corporation, Armonk, N.Y.

[21] Appl. No.: 216,578

[22] Filed: Mar. 22, 1994

[51] Int. Cl.⁶ .............................................. G11C 7/00
[52] U.S. Cl. ................................. 365/222; 365/225.7
[58] Field of Search .................... 365/222, 225.7, 191, 365/236

[56] References Cited

U.S. PATENT DOCUMENTS

| | | | |
|---|---|---|---|
| 4,207,618 | 6/1980 | White, Jr. et al. | 365/222 |
| 4,347,589 | 8/1982 | Proebsting | 365/222 |
| 4,358,728 | 11/1982 | Hashimoto | 323/275 |
| 4,494,222 | 1/1985 | White et al. | 365/222 |
| 4,716,551 | 12/1987 | Inagaki | 365/222 |
| 4,771,406 | 9/1988 | Oishi et al. | 365/222 |
| 4,843,265 | 6/1989 | Jiang | 307/591 |
| 4,883,976 | 11/1989 | Deane | 307/291.2 |
| 4,935,900 | 6/1990 | Ohsawa | 365/222 |
| 4,972,376 | 11/1990 | Torimaru et al. | 365/222 |
| 4,984,210 | 1/1991 | Kumanoya et al. | 365/222 |
| 5,146,430 | 9/1992 | Torimaru et al. | 365/222 |
| 5,243,576 | 9/1993 | Ishikawa | 365/222 |
| 5,345,574 | 9/1994 | Sakurada et al. | 365/222 |

Primary Examiner—David C. Nelms
Assistant Examiner—Vu A. Le
Attorney, Agent, or Firm—Heslin & Rothenberg

[57] ABSTRACT

A programmable self-timed refresh circuit for a semiconductor memory array and methods for programming the self-refresh rate and for non-invasively and deterministically testing the self-timed refresh circuit for establishing/verifying a refresh rate and a wait state interval for the self-refresh operation. The programmable refresh circuit includes a self-timed oscillator that outputs a clocking signal, and a programmable pattern generator that outputs a first signal pattern and a second signal pattern. The first signal pattern is fed to a counter circuit which also receives the clocking signal. The counter circuit outputs a signal pulse whenever the count driven by the clocking signal reaches a digital pattern representation corresponding to the first signal pattern generated by the programmable pattern generator. Refresh control logic is connected to receive the pulse signal and respond thereto by refreshing a portion of the memory array of the semiconductor memory device. The second signal pattern is employed by the refresh control logic to set the wait state interval for the self-refresh operation. Multiple methods for testing the programmable self-refresh circuit are also set forth.

14 Claims, 8 Drawing Sheets

MEMORY DEVICE WITH PROGRAMMABLE SELF-REFRESHING AND TESTING METHODS THEREFORE

TECHNICAL FIELD

The present invention relates in general to semiconductor memory devices and to testing methods therefore, and in particular, to a programable self-timed refresh circuit for a memory device, such as a random access memory (RAM), and to methods for "non-invasively" and deterministically testing the self-timed refresh circuit; for establishing/verifying a refresh rate and a wait state interval for the self-timed refreshing of the memory device.

BACKGROUND ART

Each memory cell in a memory array of a dynamic random access memory (DRAM) structure includes a charge-storage capacitor element and a MOSFET controlling input into and output from the capacitor element. Stored information is represented by the charge across the capacitor element. This charge decays over time due to MOSFET leakage current and to charge recombination on the surface of the semiconductor substrate. Therefore, a process of periodically "refreshing" stored information is required. For accomplishing refresh processing at high efficiency, a number of refresh modes have been developed. One common technique is referred to as the "CAS (Column Address Strobe) Before RAS (Row Address Strobe)" (CBR) refresh mode in which start of refresh is signalled by switching the timing order of the system generated RAS and CAS signals from that of a normal operating mode.

To enhance versatility, a "sleep mode" is designed into many random access memories. An externally applied CAS before RAS transition thus initiates sleep mode and thus self-refreshing of the memory array. Self-timed refreshing of the memory array typically utilizes a Row Address Counter (RAC), also referred to as a RAC counter, to track refreshing of the memory array and the mode is maintained as long as the system generated RAS signal is held constant.

Implementation of an integrated, self-timed refresh circuit within a semiconductor memory device raises three concerns. First, with any refresh circuit implementation it is highly desirable to maintain specified product timing parameters so that performance of the memory device does not deteriorate. Second, data integrity of the memory device must be maintained by compensating self-timed refresh intervals with changes in process and operating conditions. For example, if temperature increases, the memory cells become leakier and, thus, it is desirable to refresh the memory array more often. Third, "non-invasive" functional verification of memory device performance is desired, which also minimizes test time. Presently, there is no known self-timed refresh circuit and testing method which adequately address all of these concerns.

Thus, a novel, programmable self-timed refresh circuit for integrating with a random access memory, which is susceptible to "non-invasive" and deterministic testing methods for accurate programming and testing of the refresh rate and wait state interval of the refresh mode, will significantly advance the state-of-the-art.

The present invention provides such circuitry and programming/testing methods.

DISCLOSURE OF INVENTION

Briefly summarized, this invention comprises in one aspect a programmable refresh circuit integrated with a semiconductor memory device having a memory array accessed through word lines and bit lines. The programmable refresh circuit includes a self-timed oscillator that outputs a clocking signal and a programmable pattern generating means that generates a first signal pattern. A counter means is connected to receive the clocking signal output from the self-timed oscillator and the first signal pattern generated by the programmable pattern generating means. The counter means has a count driven by the clocking signal and outputs a signal pulse upon the count reaching a digital pattern representation corresponding to the first signal pattern. Refresh control logic is connected to the counter means for receiving the signal pulse output and responding thereto by refreshing a portion of the memory array of the semiconductor memory device such that output of multiple signal pulses from the counter means to the refresh control logic defines a refresh rate. Various enhancements are also presented including means for disabling active refreshing of the memory array for a programmable "wait state" interval subsequent to receipt of a signal initiating self-refresh.

Also presented are various methods for programming/testing self-refreshing of a semiconductor memory device by a programmable refresh circuit integrated therewith. The semiconductor memory device receives a row address strobe (RAS) signal and a column address strobe (CAS) signal from an external control system. A first method includes the steps of: initiating self-refreshing of the memory array upon receipt of a "CAS Before RAS" transition of signals at the semiconductor memory array; pulsing the CAS signal at a known time $t_x$ after initiating of self-refreshing; monitoring an output of the memory array for a data out transition responsive to the CAS signal pulsing; if a data out transition is monitored, incrementing time $t_x$ by a constant time increment $t_c$ and repeating the above-outlined processing steps; if no data out transition is monitored, determining a time interval from initiating self-refresh to time $t_x$ at which the CAS signal pulsing fails to result in monitoring of a data out transition; and using the determined time interval to program the self-refreshing characteristics of the semiconductor memory device. Programmable self-refresh characteristics include the refresh rate and the wait state interval.

In another embodiment, a method for testing self-refreshing of a semiconductor memory device is presented. The memory device has a memory array accessed through word lines and bit lines and a programmable refresh circuit integrated therewith for refreshing the memory array. The device receives a row address strobe (RAS) signal and a column address strobe (CAS) signal from an external control system. This testing method includes: blanket writing the memory array to a first state; writing a second state to 'X' successive sections of the memory array; actively self-refreshing the memory array for a first known time interval $t_1$; writing the second state to 'Y' successive sections of the memory array; reading the memory array and counting the number of refresh sections between the successive sections having the second state written thereto; repeating the above-outlined steps for a second known time interval $t_2$; and determining from the number of refresh sections read and from the first known time interval $t_1$ and the second known time interval $t_2$ a self-refresh characteristic of the programmable refresh circuit integrated with the semiconductor memory device.

In yet another aspect, a method is presented for testing self-refreshing of a semiconductor memory device having a memory array and a programmable refresh circuit integrated therewith for refreshing the memory array when in refresh mode. The programmable refresh circuit has a single counter and the semiconductor memory device receives a row address strobe (RAS) signal and a column address strobe (CAS) signal from an external control system. Further, the memory device receives a current from a power supply. The testing method employs a predefined equation relating ac current of the semiconductor memory device in refresh mode to frequency of the single counter within the programmable refresh circuit. The method includes: measuring dc current input to the semiconductor memory device from the power supply; placing the memory device in self-refresh mode and measuring self-refresh current input to the semiconductor memory device from the power supply; eliminating the measured dc current component of the measured refresh current to obtain a resultant ac current input to the semiconductor memory device in refresh mode; and employing the predefined equation to establish counter frequency, wherein the refresh rate and wait state interval are each proportional to the established counter frequency.

To restate, the present invention provides a programmable self-timed refresh circuit integrated with a semiconductor memory device which accurately refreshes the device when in "sleep mode," and has an accurately programmable refresh rate and wait state interval when in sleep mode. Further, methods for programming/testing the programmable refresh circuit are presented. Specifically, methods are provided for programming the refresh rate and the wait state interval for refreshing the semiconductor memory device and for non-invasively testing the refresh rate and wait state interval once programmed. Because the methods are non-invasive, and deterministic, testing can occur within a fraction of the time previously required. The programmable refresh circuit will maintain specified product timing parameters so that performance of the memory device will not deteriorate. Data integrity of the device is maintained by the self-timed oscillator compensating for changes in process and operating conditions.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which.

BEST MODE FOR CARRYING OUT THE INVENTION

Refer now to the drawings wherein the same reference numbers are used throughout multiple figures to designate the same or similar components.

Figure 1:
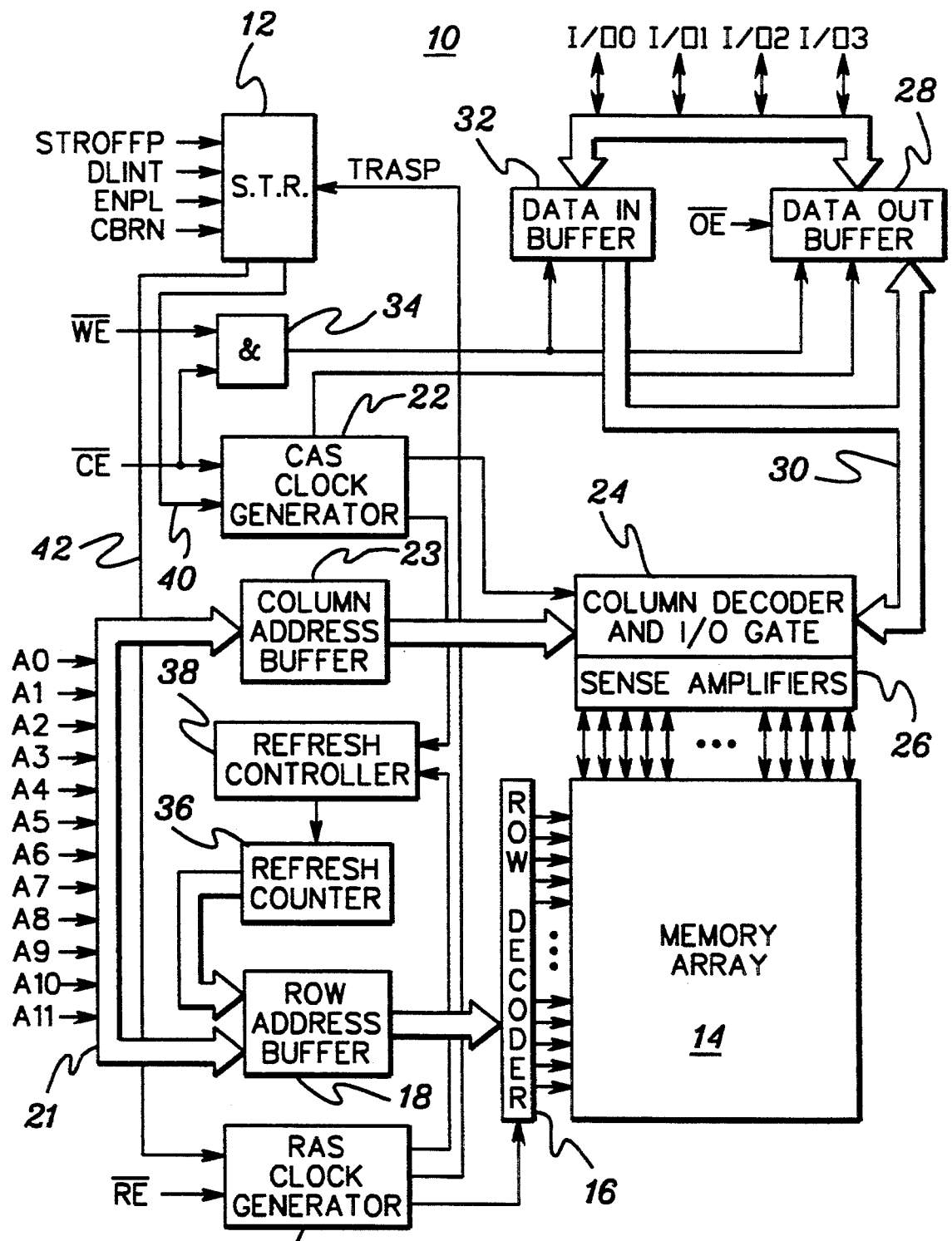
FIG. 1 is a block diagram circuit of a semiconductor memory device incorporating a self-timed refresh (S.T.R.) circuit in accordance with the principles of the present invention.

FIG. 1 presents an overview of a semiconductor memory device, generally denoted 10, having an integrated self-timed refresh circuit 12. Semiconductor memory device 10 includes a memory array 14 consisting of a plurality of memory cells arranged in a conventional grid configuration accessed by word lines and bit lines (not shown). In one embodiment, each memory cell comprises a one-transistor/one-capacitor memory cell consisting of an n-channel transistor and a capacitor element. A row decoder 16 decodes an address received at inputs A0, A1, A2, ..., A11, and temporarily held in a row address buffer 18. Using the decoded address, row decoder 16 selects one word line of memory array 14. A RAS clock generator 20 clocks row decoder 16. When in normal operation, RAS clock generator 20 responds to a "Row Enable Not" (RE) master signal. Further, a CAS clock generator 22 responds to a received "Column Enable Not" (CE) signal.

CAS clock generator 22 generates the clock that drives a column decoder and I/O gate 24. Column decoder and I/O gate 24 is coupled through sense amplifiers 26 to the bit lines (not shown) of memory array 14. Sense amplifiers 26 amplify read data signals to a voltage signal level employed by the semiconductor memory device. After a row address has been asserted and the row has been selected in the array, at a point in time later, a column address is asserted that identifies which node in the array, i.e., which piece of data, is selected. The selected data is then brought out through a data out buffer 28. Data out buffer 28 drives off-chip loads (not shown) through the input/output connections, for example, I/O0, I/O1, I/O2, and I/O3. Buffer 28 is itself driven by an "Output Enable Not" (OE) signal.

Data is written into memory array 14 from the input/output connections through a data in buffer 32 and column decoder and I/O gate 24. An AND circuit 34 receives as input a "Write Enable Not" (WE) and the "Column Enable Not" (CE) signals. This circuit outputs a signal to both data out buffer 28 and data in buffer 32. This signal designates whether the desired function comprises a read operation or a write operation.

The balance of this disclosure focuses on the self-refreshing of semiconductor memory device 10 and includes programming/testing methods for establishing/verifying refresh characteristics such as the refresh rate and wait state interval of the programmable refresh circuit in accordance with the present invention.

The most effective integration of a self-refresh function into a random access memory, such as shown in FIG. 1 is accomplished so that previously specified random access memory performance and functional parameters are maintained. Towards this end, it is desirable that the self-refresh control logic be self-contained and designed such that it control the semiconductor memory device at the RAS and CAS clock generators when in "sleep mode". This then maintains specified performance in that delays of the control logic remain constant in self-refresh for normal device operating mode.

A refresh counter 36 (e.g., a RAC counter) contains multiple latches which identify a next section (e.g., row) of memory array 14 to be refreshed. Counter 36 is incremented in refresh mode with initiation of each new (CBR) refresh cycle. Row address buffer 18 obtains a next row address by reading the state of refresh counter 36 subsequent to initiation of the refresh mode. Upon start of an active refresh cycle, buffer 18 ignores signals on address bus 21 of semiconductor memory device 10 and instead receives the state of refresh counter 36, which identifies a next section of memory array 14 to be refreshed.

Refresh mode is initially detected by a conventional refresh controller 38 upon receipt of a "CAS Before RAS" (CBR) transition of signals. In particular, refresh mode is detected by refresh controller 38 whenever the "Column Enable Not" (CE) signal goes "active" before the "Row Enable Not" (RE) signal goes "active", i.e., upon selection of the semiconductor memory device. As used herein, "active" is assumed to comprise a low signal.

Simultaneous with commencing refresh mode, the S.T.R. circuit 12 is enabled to monitor whether the RE and CE inputs remain low for a given interval of time, referred to herein as the "wait state". Assuming that these inputs are maintained through the "wait state", then a flag is tripped in the S.T.R. circuit to indicate that the semiconductor memory device is in self-refresh mode and refreshing of the memory array will occur, for example, row-by-row at a substantially fixed refresh rate. After wait state conditions have been satisfied, the CAS buffer is disabled and becomes a "don't care" during self-refresh mode. However, signal RE is continually monitored by S.T.R. 12 for an external exit request.

Once entering self-refresh mode, control signals will be output on lines 40 and 42 to the CAS clock generator 22 and the RAS clock generator 20, respectively, to disable the generators from responding to external signals presented to the CE and RE inputs during a refresh cycle. In effect, the generators are deactivated from external system control when the memory device is undergoing active refreshing of the memory array. This guarantees that the refresh cycle will be completed before control of the generators can be returned to the external system. Otherwise, the external controller might start to restore the array before all refresh data is back into the corresponding storage cells, with a resultant loss of data. Thus, control protocol is such that an active refresh cycle takes precedence over the external system trying to take control of the semiconductor memory device, i.e., until the current refresh cycle has been completed and the memory device has returned to "sleep mode."

An S.T.R. circuit 12 in accordance with the invention receives four input signals. First, a "CAS Before RAS Not" (CBRN) signal is received from refresh controller 38 whenever the controller detects that the column address strobe (CAS) goes low before the row address strobe (RAS). Also received at circuit 12 are three handshaking signals, namely, a power up enable (ENPL) signal, a data line interlock left (DLINT) signal, and a RAS clock generator off (STROFFP) signal. The ENPL signal ensures that the self-time refresh control logic cannot assert itself when the semiconductor memory device is in power-up mode. The DLINT signal, produced from the memory array, signals completion of a current refresh cycle of operation, and the STROFFP signal confirms to the S.T.R. circuit that it has control of the RAS clock generator.

Figure 2:
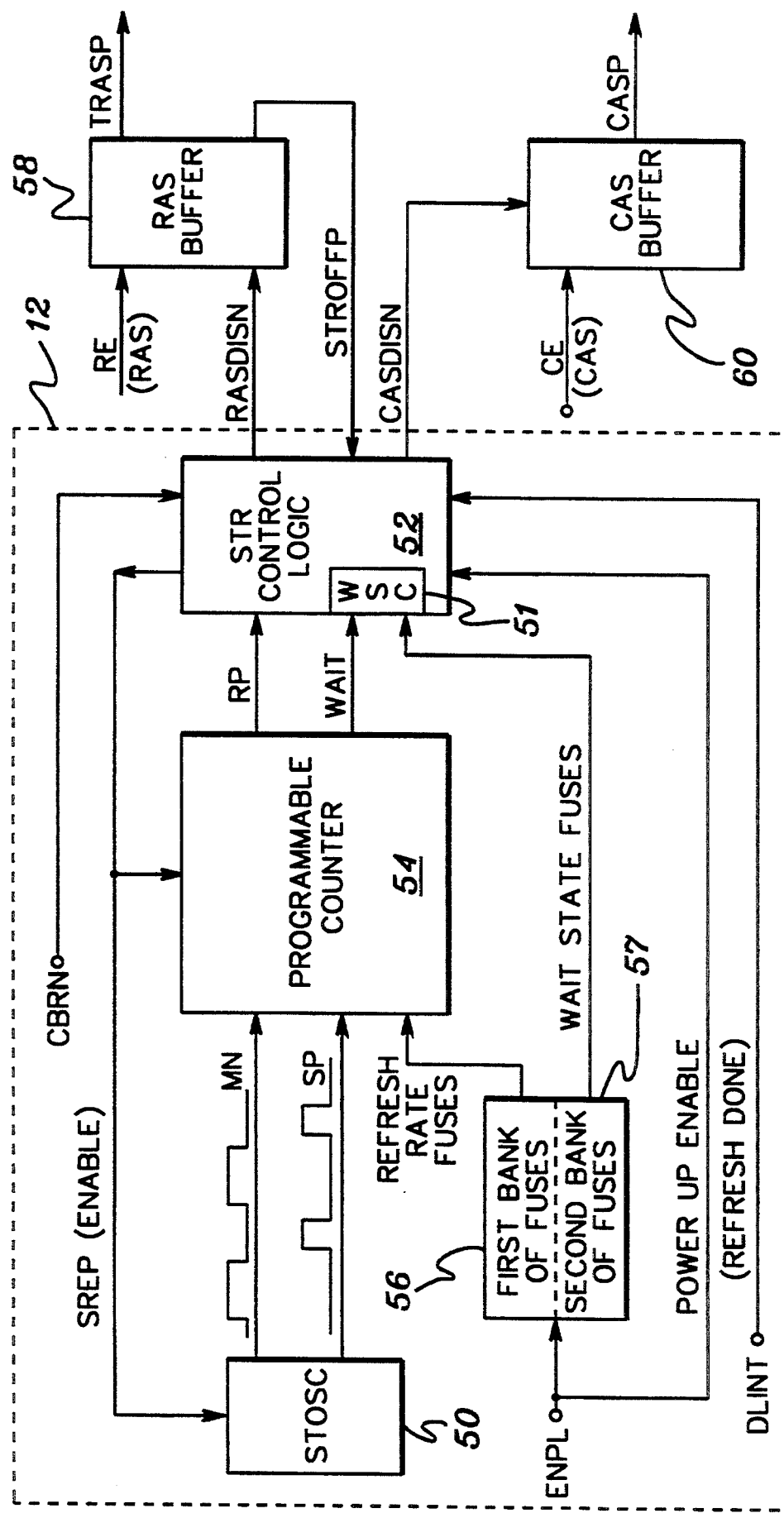
FIG. 2 is a block diagram circuit of one embodiment in accordance with the present invention of the self-timed refresh (S.T.R.) circuit of FIG. 1.

One embodiment of a programmable self-timed refresh control circuit 12 in accordance with the invention is depicted in FIG. 2. In this embodiment, circuit 12 includes a self-timed oscillator (STOSC) 50 which outputs two non-overlapping clock signals, e.g., signal MN and signal SP as shown. Oscillator 50 is enabled by a self-refresh enable pulse (SREP) generated by a self-timed refresh control logic 52. Logic 52 generates this oscillator enable signal SREP when the logic is itself enabled by power up enable signal ENPL and, a "CAS Before RAS Not" (CBRN) signal is received. Also enabled by the self-refresh enable pulse output from logic 52 is a programmable counter circuit 54. The ability to program the output of counter 54 is significant since oscillator 50 frequency is traditionally variable with process biases. For enhanced granularity of control, counter circuit 54 preferably is a divide-by-N synchronous count-down counter, wherein N is an integer.

Data integrity of the memory device must be maintained by compensating self-timed refresh intervals with operating conditions. For example, as applied voltage increases, the resultant higher electric fields aggravate parasitic leakage in the memory cells. Thus, it is desirable that the oscillator frequency increase with voltage. Similarly, parasitic leakage mechanisms can also be aggravated by increased temperature. Thus, it is desirable that the oscillator respond appropriately. Process parametric variations can also affect chip-to-chip and wafer-to-wafer oscillator frequency. This source of variation is controlled by the fuse programmable counter, which provides a consistent self-timed refresh frequency notwithstanding various oscillator input frequencies, i.e., through programming of the fuses.

As shown, counter circuit 54 is connected to a "first bank of fuses" 56 which, as explained below, allows a system designer to set the refresh rate, i.e., the interval of time between RP pulse signals output from the counter circuit. First bank of fuses 56 can comprise any appropriate signal generating means having a programmable output pattern, such as a parallel circuit of laser fuses which can be "programmed" by open circuiting or burning selected fuses. Open circuiting of selected fuses and passing the signals through a comparator allows the count of counter circuit 54 at which pulse signal RP will be outputted to be programmed. Specifically, when the instantaneous count has a digital pattern representation corresponding to the pattern of signals from the associated first bank of fuses, then the comparator outputs an RP pulse signal to the self-timed refresh control logic 52. Resetting the counter and repeating the process establishes an RP rate of output, or refresh rate. The desired refresh rate is programmed based on the characteristics of the particular semiconductor memory device to which circuit 12 is integrated. Fuses 56 can comprise poly-silicon stripes on the integrated circuit chip, which when exposed to a conventional laser fuse tool are open circuited (or enabled), since counter circuit 54 is preferably implemented as a count down counter.

Figure 5:
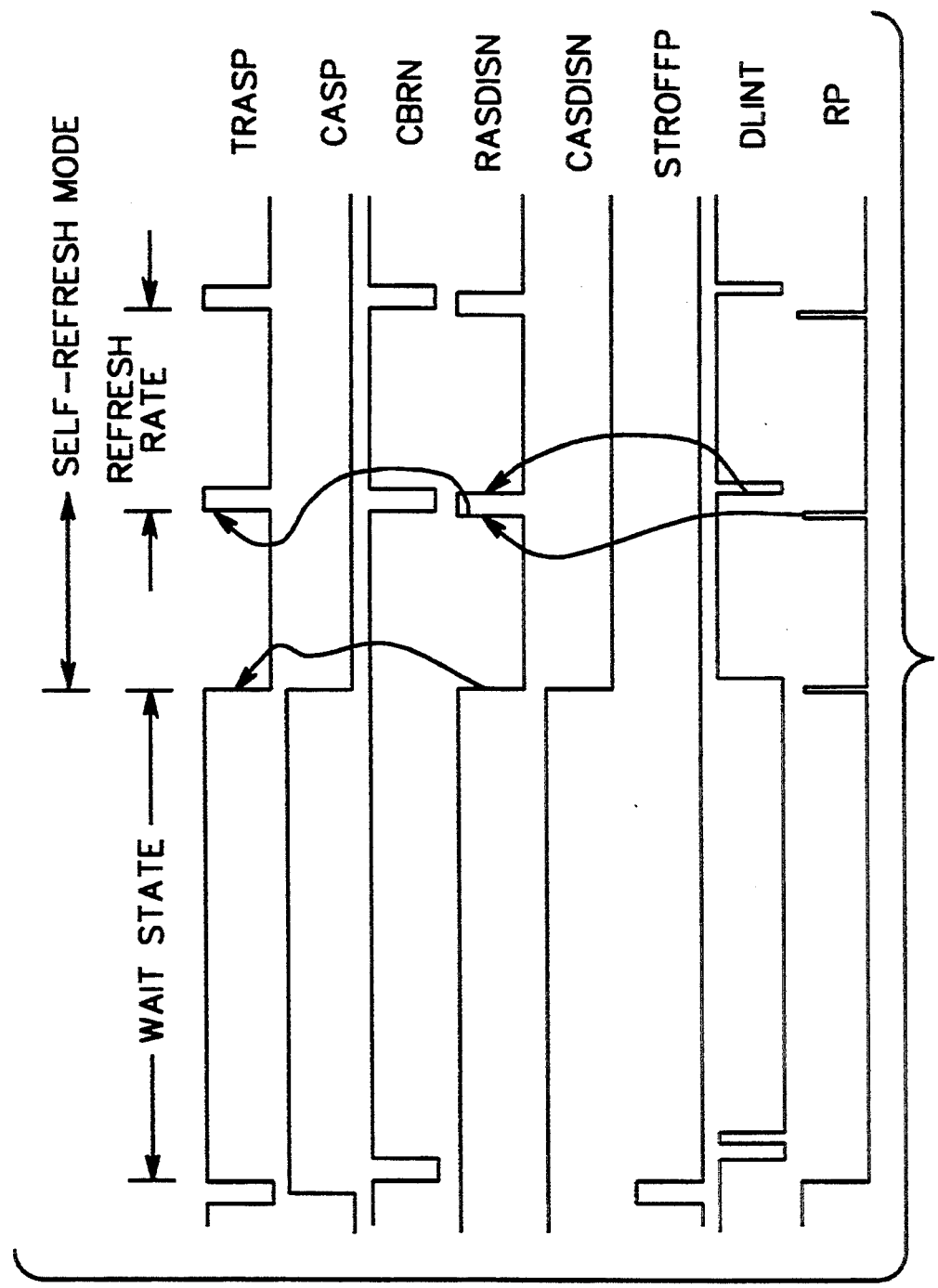
FIG. 5 is a timing diagram of self-timed refresh processing in accordance with the present invention.

Upon completion of the "wait state," STR control logic 52 outputs a "RAS Disable Not" (RASDISN) signal to a RAS buffer 58 disposed in RAS clock generator 20 (FIG. 1), and a "Column Address Strobe Disable Not" (CASDISN) signal to a CAS buffer 60 disposed in CAS clock generator 22 (FIG. 1). RASDISN and CASDISN signals comprise the above-noted signals which deactivate the RAS and CAS generators, respectively, for the duration of an active refresh cycle or operation. As shown in the timing diagram of FIG. 5, the falling edges of the RASDISN and CASDISN signals occur in response to a DLINT (refresh complete) signal from the memory array. The RASDISN signal takes control of the internal RAS bus and provides handshaking with external exit requests. This signal controls active refresh events during a self-refresh mode. For power reduction means, the CASDISN signal disables the CAS buffer and deactivates the CAS internal bus which in turn disables all external signals to memory device 14 (FIG. 1) except the RAS clock generator.

Output from RAS buffer 58 is a "TRASP" signal (FIG. 5) which goes low in response to the RASDISN signal going low after completion of the wait state. This causes the semiconductor memory device to go inactive, or enter "sleep mode." CAS buffer 60 outputs a CASP signal which goes active low when in self-refresh mode. Also output from RAS buffer 58 is the "Self-timed Refresh Off Pulse" (STROFFP) signal which goes high when the external RAS enable (RE) signal input to RAS buffer 58 is pulled high, meaning that the control system wishes to pull out of self-refresh mode. This is accomplished by logic 52 sending signal RASDISN low to reactivate the RAS enable (RE) input to RAS buffer 58. Again, STR circuit 12 will relinquish control only when not actively refreshing a section of the memory array (referred to herein as a "refresh cycle").

As briefly noted above, when initially entering a refresh mode, a "wait state" must occur prior to initiation of active refreshing. This is to ensure that an identified "CAS Before RAS" (CBR) transition of signals is intended to initiate active refreshing of the memory array. A comparator (not shown) within STR control logic 52 (FIG. 2) receives "wait" pulses from counter circuit 54, e.g., the states of multiple higher order digits of the count maintained by circuit 54, and compares these signals with a fuse programmed pattern of signals, such as that supplied by a second bank of fuses 57. As will be apparent from the discussion below, a significant feature of self-timed refresh circuit 12 in accordance with the present invention comprises the use of a single counter that drives two different comparators which determine the active refresh rate and the wait state interval characteristics.

Figure 3:
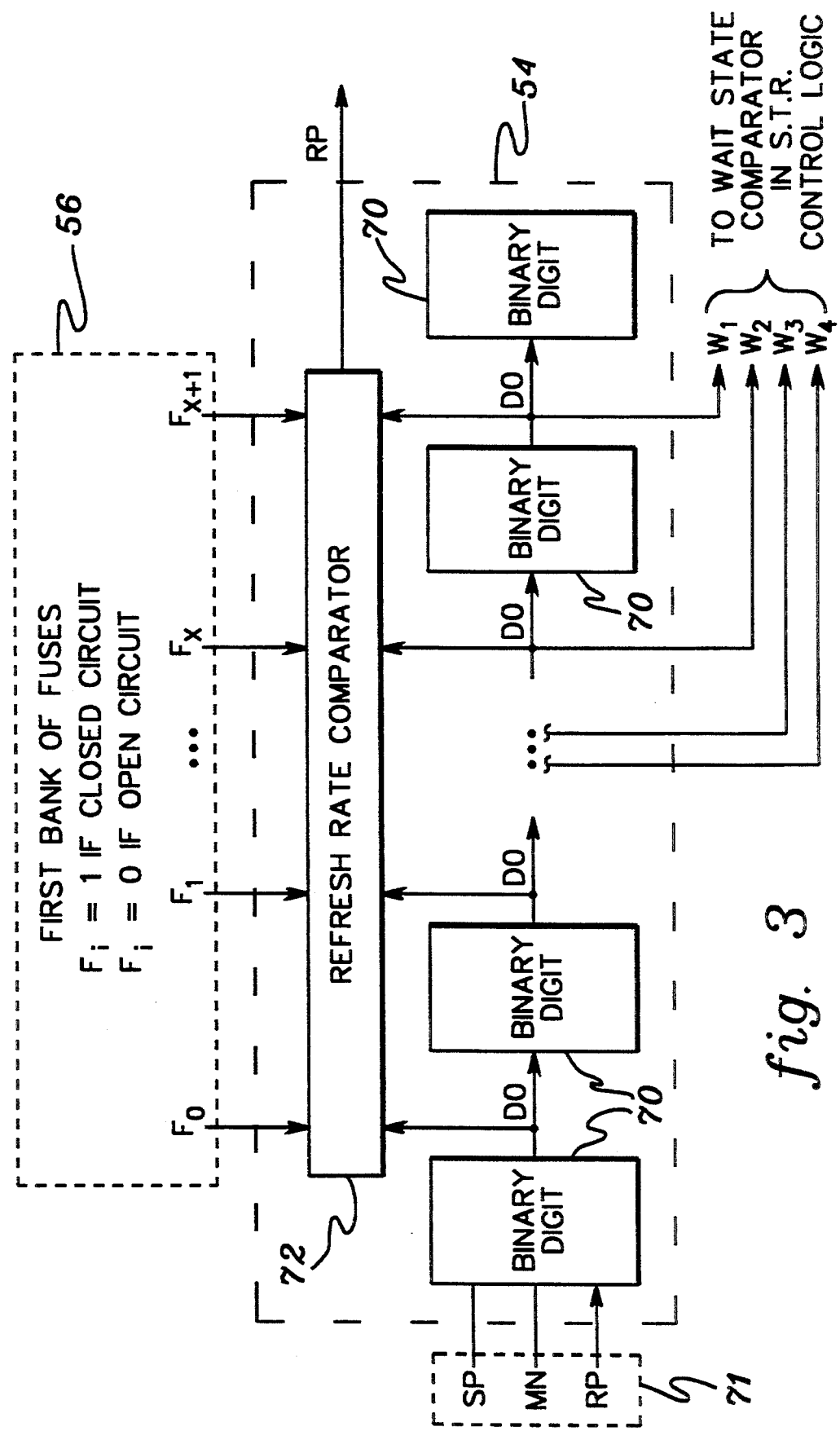
FIG. 3 is a block diagram circuit of one embodiment of the programmable counter and associated first fuse bank of FIG. 2.

FIG. 3 depicts one embodiment of a programmable counter 54 in accordance with the present invention. Again, the counter circuit is preferably configured as a count down counter, and is connected to reset itself to an all '1' state by feedback of the RP pulse signal as a reset clock to all digits of the counter, thereby producing a '1' on all binary digit 70 outputs DO. In the embodiment presented, the programmable pattern of signals fed to counter circuit 54 is provided by first bank of fuses 56. Specifically, for each binary digit output DO there is a corresponding fuse output $F_0, F_1 \ldots F_x, F_{x+1}$, from the first bank of fuses. If an associated fuse is open circuited, then the output signal is low, otherwise the signal remains high. A comparator 72 receives binary digit outputs DO and fuse outputs $F_0, F_1 \ldots F_x, F_{x+1}$, and outputs an RP pulse signal whenever the respective output patterns are the same. In one embodiment, comparator 72 comprises a plurality of two input NAND gates, each of which is connected to receive the state of a binary digit and a corresponding fuse output from the first bank of programmable fuses.

Each binary digit receives signals 71, which include the non-overlapping clock signals MN and SP from the self-timed oscillator 50 (FIG. 2). Preferably, the binary states of multiple higher order digits $W_1$, $W_2$, $W_3$ and $W_4$ 70 are bundled and output as a "WAIT" signal to a wait state comparator (WSC) 51 (FIG. 2) in the self-timed refresh control logic. The more bits bundled as output to the wait state comparator, the greater the programming flexibility for adjusting the wait state interval based upon the pattern of signals provided via the second bank of fuses 57 (FIG. 2). Programming of the wait state interval is analogous to that of the above-described programming of the refresh rate.

Figure 4:
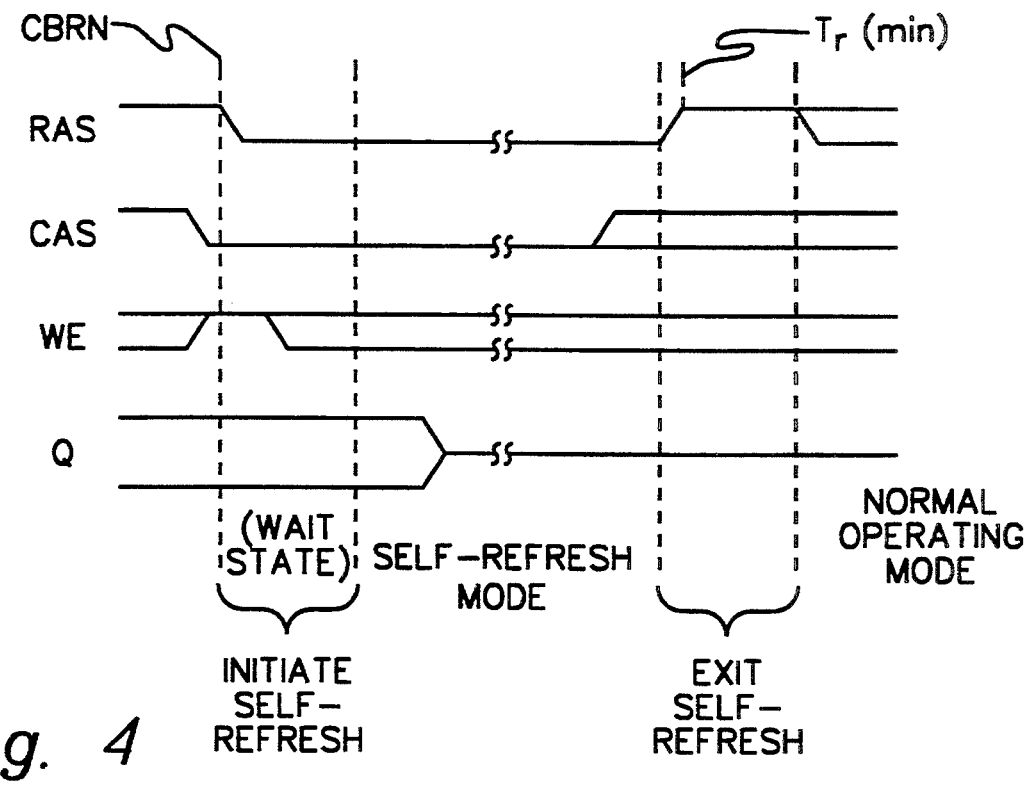
FIG. 4 is a timing diagram of a JEDEC proposed "CAS Before RAS" (CBR) self-refresh of a semiconductor memory device, followed by exit to a normal operating mode.

FIG. 4 depicts a proposed convention for a "CAS Before RAS" (CBR) refresh initiation option. As shown, self-refresh mode occurs when the externally supplied CAS signal drops low before the RAS signal and the signals are held low for an interval of time, referred to as the "wait state". Upon completion of the wait state, and assuming that the RAS and CAS inputs have remained constant, self-refresh mode operation commences. The wait state interval should be in excess of the random access memory's maximum active specification. Once in self-refresh mode, the memory device is internally cycled through each refresh address at a sufficient frequency to ensure against loss of information in the memory array. Sufficiency of the frequency depends upon the design parameters of the particular random access memory and upon process variations.

Refresh mode is exited outside an active refresh by the RAS signal going inactive (i.e., high). Note that as refresh mode is exited, the RAS signal must remain inactive, i.e., before commencing normal operating mode, for a minimum period of time $T_r$ (min) equal to the time required to complete at least one random read or write cycle. As shown in FIG. 4, the "Write Enable" (WE) signal comprises a "don't care" signal except for upon initiation of CBR, i.e., the write enable (WE) signal must be high in combination with receipt of a CBR to initiate self-refresh. Data output 'Q' comprises a "don't care" signal and will tristate to an undriven level at some point in time after self-refresh mode commencement.

Various programming/testing methods are next described for establishing and verifying self-refresh characteristics including the refresh rate and wait state interval. Each method determines counter frequency non-invasively since no special test hardware is required to measure oscillator frequency (i.e., counter frequency). Because each method determines counter frequency non-invasively and deterministically, programming and testing can occur within a fraction of the time required by heretofore known techniques, which typically non-deterministically verify self-refresh mode by maintaining S.T.R. for some length of time and noting no loss of data.

A first method makes use of a recognition that the CAS signal becomes a "don't care" signal after commencing self-refresh mode. Thus, when CAS comprises a "don't care" signal its state can be toggled without affecting output 'Q' at the input/output terminals of the semiconductor memory device. However, this only occurs after self-timed refreshing becomes active, i.e., after the wait state. If CAS is toggled while in the wait state, then data 'Q' will respond. Thus, it can be seen that by moving an up/down CAS pulse signal in time, and looking at the data output, the point in time at which self-refresh mode becomes active can be ascertained, and that, therefore, the wait state interval can be verified. This assumes that the wait state interval is defined as the time interval between the CBRN signal and tristating of the data output, which is substantially correct.

Since a single counter is employed, it is possible to establish both the wait state interval and the refresh rate. By knowing the wait state interval and the frequency of counts for a given temperature and voltage, then a desired refresh rate can be programmed/verified. Thus, a mathematical relationship exists between the wait state interval and the refresh rate, and the interval between RP pulses can be readily determined. By way of example, if a desired refresh rate is 1 microsecond between active refresh cycles (see FIG. 5), then by knowing the counter frequency, the refresh rate can be programmed by open circuiting selected fuses in the first bank of fuses 56 (FIG. 2).

Figure 6:
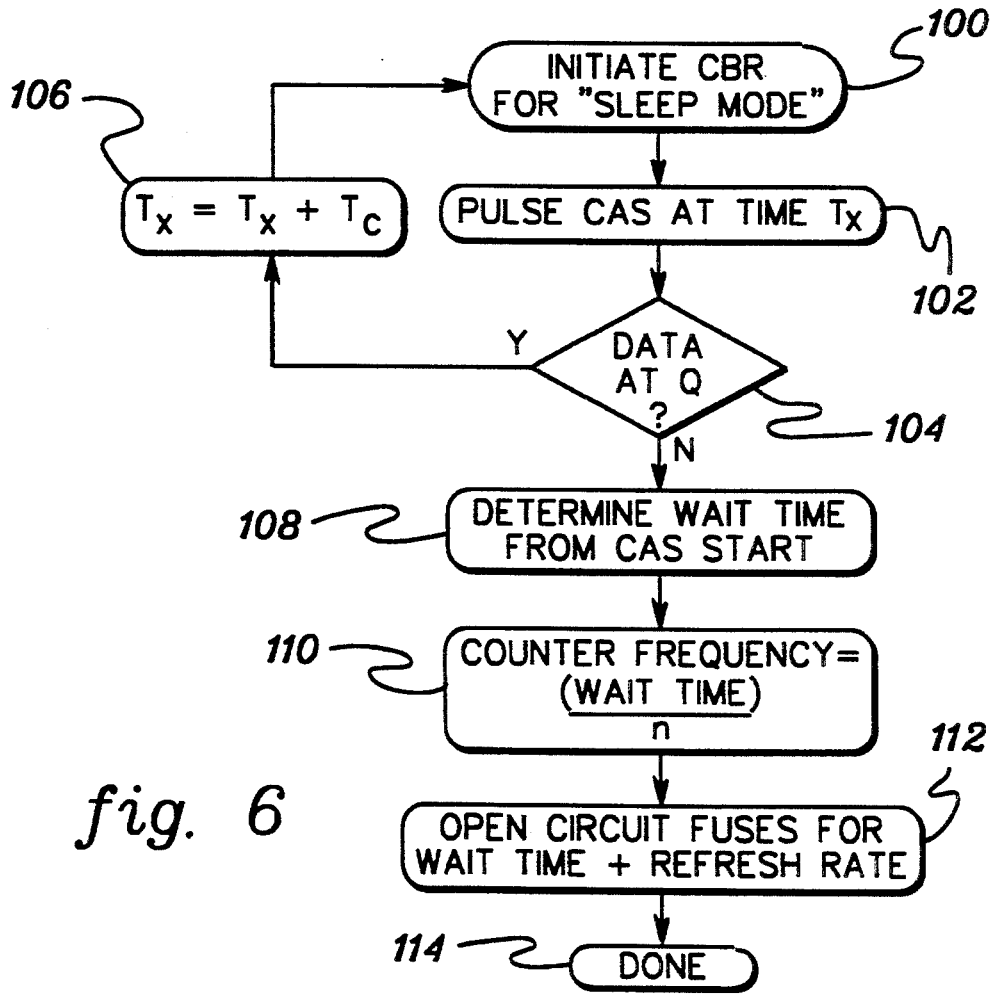
FIG. 6 is a flowchart of a programming/testing process embodiment in accordance with the present invention for establishing/verifying a desired wait time and refresh rate for the programmable refresh circuit of FIG. 2.

FIG. 6 presents a programming/testing method essentially as outlined above. Once a refresh command is executed, 100 "Initiate CBR," n internal oscillator cycles are counted before active refresh cycles begin. The wait state is determined by pulsing the CAS signal at a time $T_x$ after CBRN execution, 102 "Pulse CAS At Time $T_x$," and then inquiring whether an active data signal occurs at the memory array output, 104 "Data At 'Q'?" If "yes," then the time at which the CAS signal is pulsed is incremented by a constant time interval $T_c$, 106 "$T_x = T_x + T_c$." Thereafter, this processing repeats with execution of a new CBR command.

The wait state is easily measured with a testing circuit monitoring the data output pin of the memory after issuing a CBR refresh command, 108 "Measure Wait Time From CBR Start." The device recognizes a CAS pulse outputting data on lines I/O0, I/O1, I/O2 and I/O3 until the end of the wait state interval whereupon the data output tristates. Thus, the wait state is determined by the difference in time between the start of the sleep mode command and the point at which the device's data output tristates. Thereafter, counter frequency is determined by dividing the wait time by the number of counts N in the wait state, 110 "Counter Frequency = (Wait Time) ÷ N." Again, 'N' is determined by the pattern of signals provided via the second bank of fuses.

After the wait state is established and oscillator frequency is determined, the appropriate fuses are open circuited in the first bank of fuses and the second bank of fuses to set the refresh rate and the wait state time, respectively, 112 "Open Circuit Fuses For Wait Time & Refresh Rate." This completes self-refresh programming of the semiconductor memory device, 114 "Done." The processing of FIG. 6 can then be repeated (with the exception of instruction 114) to verify that the desired wait state interval and refresh rate have been programmed through the fuse banks.

Figure 7:
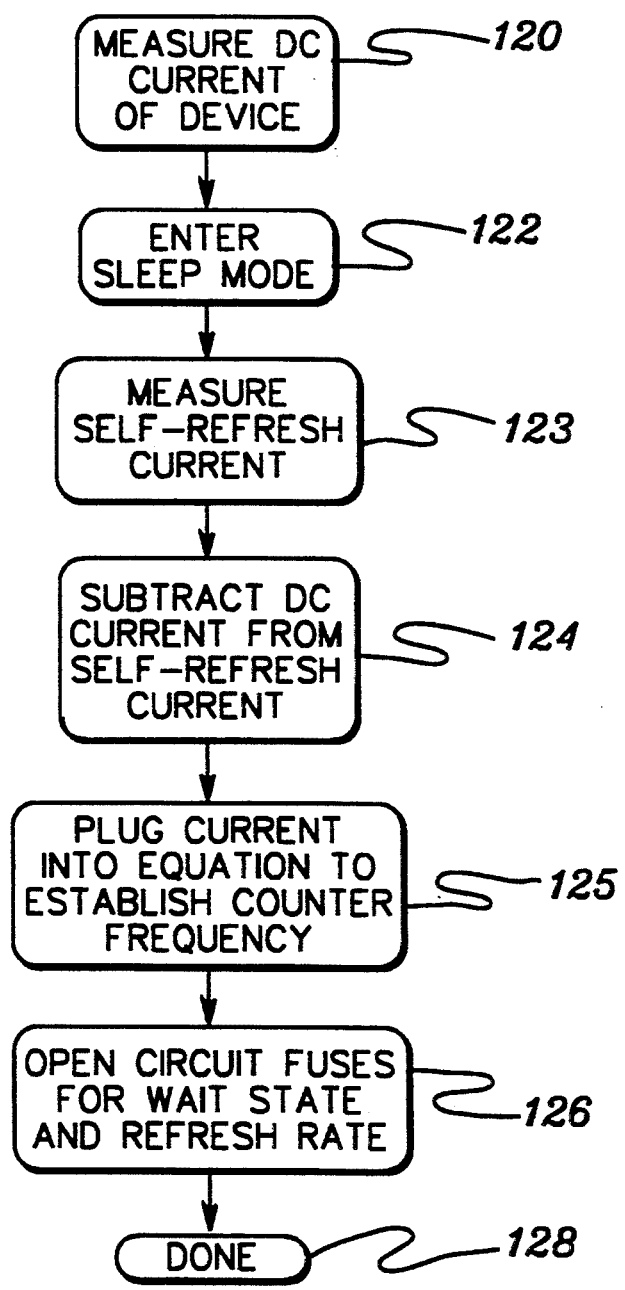
FIG. 7 is a flowchart of another programming/testing process embodiment in accordance with the present invention for establishing/verifying a desired wait time and refresh rate within the programmable refresh circuit of FIG. 2.
Figure 8:
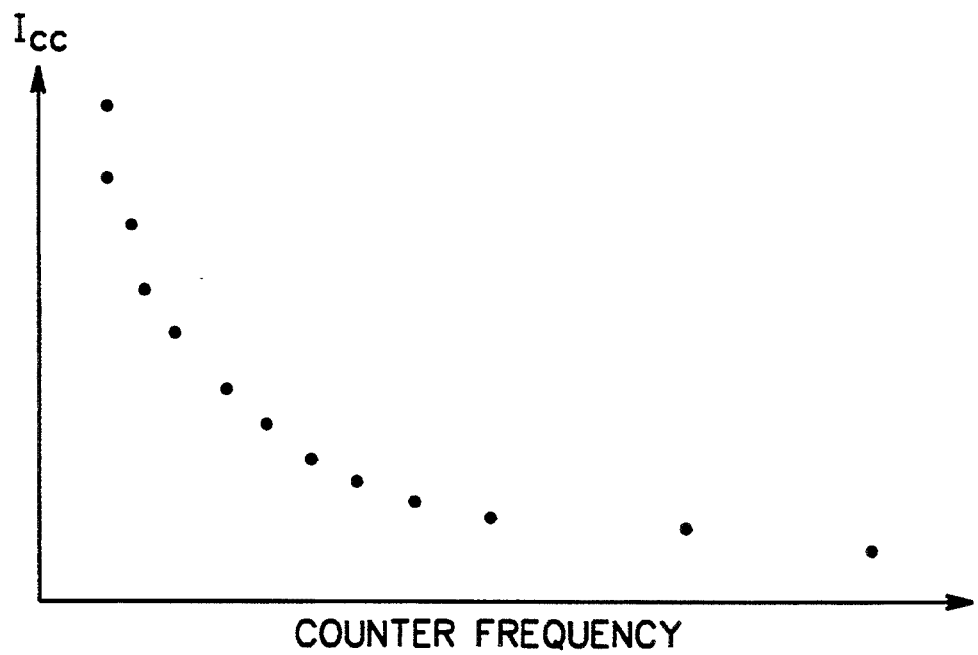
FIG. 8 is a graph of power supply current ($I_{cc}$) versus counter frequency for a semiconductor memory device in refresh mode.

FIG. 7 depicts an alternate processing embodiment for programming/testing wait state time and refresh rate. Again, this processing approach is non-invasive and requires no special test hardware to measure the oscillator frequency. The method utilizes the current signature of the memory array when in refresh mode, i.e., a measurement of power supply current $I_{cc}$ when the memory device is in sleep mode, from which the dc current component is subtracted. The resultant ac current is then plugged into a predetermined equation to establish the oscillator rate. This predetermined equation can be empirically established by one of ordinary skill in the art through a characterization of the design, and is based on multiple measurements of $I_{cc}$ current versus various counter frequencies (e.g., see FIG. 8) for the particular semiconductor memory device design. Then, a best fit equation for the resultant plot is obtained and solved for the counter frequency.

After determining such an equation, the processing of FIG. 7 can be implemented. The dc current of the semiconductor memory device is initially measured, 120 "Measure DC Current Of Chip." Thereafter, sleep mode is entered, 122 "Enter Sleep Mode," and the self-refresh current is measured, 123 "Measure Self-Refresh Current." The ac component of this current is obtained by subtracting the dc component from the self-refresh current, 124 "Subtract dc Current From Self-Refresh Current." The ac current value is then plugged into the predetermined equation to establish a counter frequency, 125 "Plug Current Into Equation To Establish Counter Frequency." If not already programmed, fuses are open circuited to program the desired refresh rate and wait state interval, 126 "Open Circuit Fuses For Wait State And Refresh Rate." Program processing is then complete, 128 "Done," and test processing can be conducted by repeating the steps of FIG. 7 (except instruction 128) to verify a programmed wait state and/or refresh rate.

Figure 9:
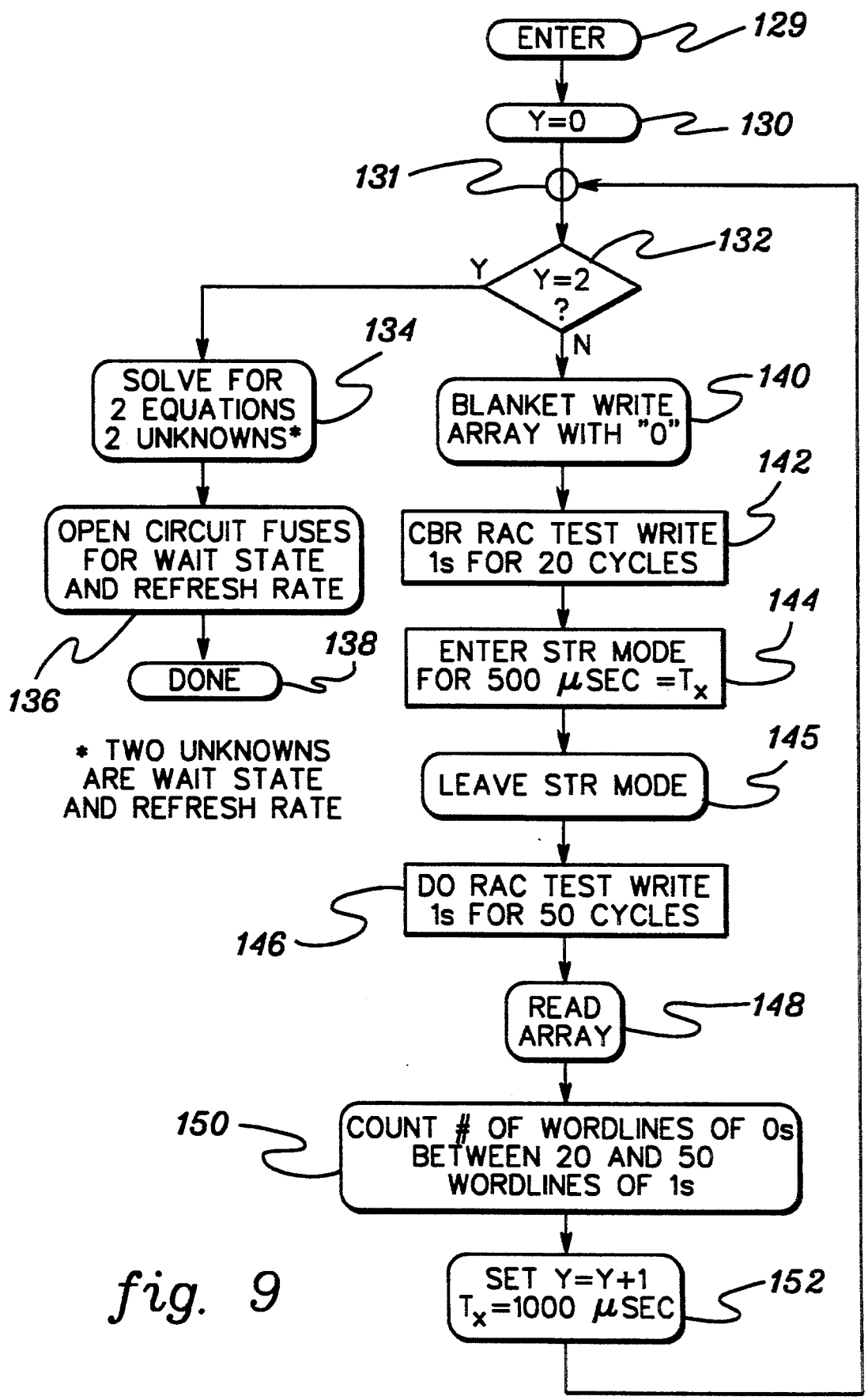
FIG. 9 is a flowchart of a further programming/testing process embodiment in accordance with the present invention for establishing/verifying a desired wait time and refresh rate for the programmable refresh circuit of FIG. 2.

FIG. 9 depicts yet another non-invasive process for programming/testing the self-timed refresh circuitry presented herein. This method makes use of the following equation:

$$\frac{STR}{\text{Time Interval}} = \text{Wait Interval} + \frac{\text{Word Lines Refreshed}}{} \times \frac{\text{Refresh Rate}}{} \quad (1)$$

Essentially, the method involves selectively conducting self-refreshing of the memory array to establish a data pattern within the memory array. This data pattern is then used to determine a self-refresh characteristic of the programmable refresh circuit. More particularly, by entering the refresh mode and counting the number of word lines refreshed in each of two active refresh time periods, two equations with two unknowns (i.e., wait interval and refresh rate) can be written, with each being proportional to the counter frequency. The two equations can then be combined and solved for one of the variables as desired.

Processing of FIG. 9 begins, 129 "Enter," with setting of a variable 'Y' equal to a zero count, 130 "Y=0." Inquiry is then made whether variable 'Y' has been twice incremented, 132 "Y=2?" Since this is the first pass through the processing, the memory array is blanket written with zeros, 140 "Blanket Write Array With '0s'." The Row Address Counter (RAC) is then successively incremented for twenty cycles while twenty rows are written with '1s', 142 "CBR RAC Test Write '1s' For 20 Cycles." The CBR RAC test is then discontinued and self-timed refresh mode is entered for a fixed time interval, for example, 500 microseconds, 144 "Enter STR Mode For 500 $\mu$sec=$T_x$."

Thereafter, the self-timed refresh mode is exited, 145 "Leave STR Mode," and the RAC test is repeated, only this time for fifty cycles, 146 "Do RAC Test Write '1s' For 50 Cycles." The memory array is read, 148 "Read Array," and the total number of word lines between the twenty word lines of '1s' and the fifty word lines of '1s' are counted, 150 "Count # Of Word lines Of 0s Between 20 And 50 Word lines Of 1s." Thus, using the above equation, a first formula of the form of Equation (1) can be written having two unknowns. Variable 'Y' is then incremented and a new fixed time interval $T_x$ is selected, for example, one thousand microseconds, 152 "Set Y=Y+1, $T_x$=1000 $\mu$sec." Return is made through junction 131 to inquiry 132 where the above-outlined processing steps are repeated, since 'Y' is only equal to one.

At the second pass through the processing, the answer to inquiry 132 will be "Yes." The resultant two equations with two unknowns can then be solved, 134 "Solve For 2 Equations 2 Unknowns." The unknowns are "wait state interval" and "refresh rate". Once these variables are determined, the appropriate fuses in the first bank of fuses and second bank of fuses can be open circuited to attain the desired wait state and refresh rate, 136 "Open Circuit Fuses For Wait State And Refresh Rate." Processing is then complete, 138 "Done." As with the other methods, the resultant self-timed refresh circuit can be tested by repeating the processing steps (except instruction 136) to verify the desired refresh characteristics, i.e., wait state and refresh rate in this case.

Figure 10:
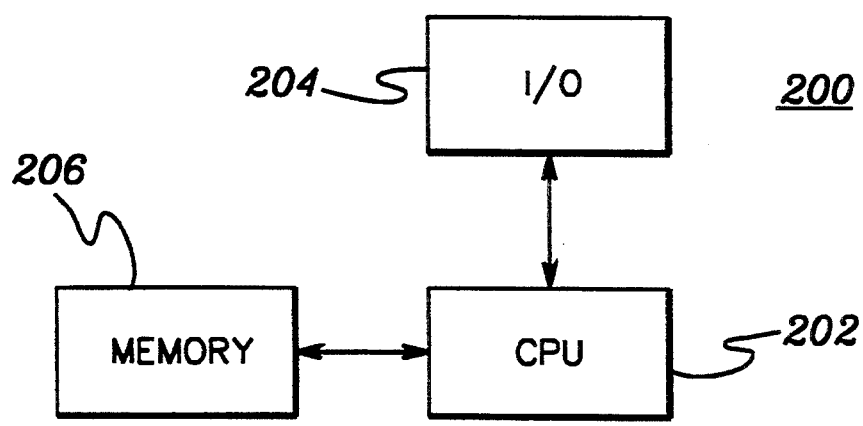
FIG. 10 is a block diagram of a data processing system having a semiconductor memory device implemented in accordance with the principles of the present invention.

FIG. 10 depicts a block diagram of a data processing system, generally denoted 200, to incorporate a memory device having a programmable self-refresh circuit in accordance with the present invention. System 200 includes, for example, a central processing unit 202, input/output (I/O) circuitry 204 and one or more memory devices 206 in accordance with the invention. In certain systems, each memory device may be implemented as a separate semiconductor memory chip. Each memory device includes the above-described self-refresh circuit and functions.

From the above discussion, it should be noted that the present invention provides a programmable self-timed refresh circuit integrated with a semiconductor memory device which accurately refreshes the device when in "sleep mode," and has an accurately programmable refresh rate and wait state interval when in self-refresh.

Further, methods for programming/testing the programmable refresh circuit are presented. Specifically, methods are provided for programming the refresh rate and the wait state interval for refreshing the semiconductor memory device and for subsequently, non-invasively and deterministically testing the refresh rate and wait state interval once programmed. Because the test methods are non-invasive and deterministic, testing can occur within a fraction of the time previously required. The programmable refresh circuit will maintain specified product timing parameters so that performance of the memory device will not deteriorate and data integrity of the device is maintained by the self-timed oscillator compensating for changes in process and operating conditions.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

We claim:

1. A programmable refresh circuit integrated with a semiconductor memory device having a memory array accessed through word lines and bit lines, said programmable refresh circuit comprising:

a self-timed oscillator that outputs a clocking signal;

programmable pattern generating means for generating a first signal pattern;

counter means connected to receive the clocking signal output from the self-timed oscillator and the first signal pattern generated by the programmable pattern generating means, said counter means having a count driven by said clocking signal and outputting a signal pulse upon the count reaching a digital pattern representation corresponding to the first signal pattern generated by said programmable pattern generating means; and refresh control logic connected to said counter means for receiving the signal pulse output therefrom, said refresh control logic responding thereto by refreshing a portion of the memory array of the semiconductor memory device, wherein output of multiple signal pulses from the counter means defines a refresh rate at which the memory array is refreshed, said refresh control logic further including means for disabling refreshing of the memory array for a programmable "wait state interval" subsequent to said refresh control logic receiving from a control system connected to the semiconductor memory device a signal initiating self-refresh, and means for enabling refreshing of the memory array subsequent to said wait state interval.

2. The programmable refresh circuit of claim 1, wherein the semiconductor device receives a row address strobe (RAS) signal and a column address strobe (CAS) signal from the control system connected thereto, and wherein the signal initiating self-refresh comprises a CAS before RAS transition of signals received from the control systems.

3. The programmable refresh circuit of claim 1, wherein the programmable pattern generating means includes means for generating a second signal pattern, and wherein said refresh control logic is connected to receive the second signal pattern generated by the programmable pattern generating means, and wherein the refresh control logic includes comparing means for comparing a portion of the digital pattern representation of the count of the counter means with the second signal pattern generated by the programmable pattern generating means to determine the wait state interval subsequent to initiation of refresh.

4. The programmable refresh circuit of claim 3, wherein said programmable pattern generating means comprises a first bank of fuses for generating the first signal pattern used to program the refresh rate and a second bank of fuses for generating the second signal pattern used to program the wait state interval.

5. The programmable refresh circuit of claim 3, wherein the counter means includes a single counter coupled to the self-timed oscillator, said single counter containing the count driven by said clocking signal.

6. A memory system comprising:
 a memory device including a memory array accessed through word lines and bit lines; and
 a refresh circuit integrated with the memory array, said refresh circuit including
  a self-timed oscillator that outputs a clocking signal,
  a programmable non-volatile frequency divider coupled to receive said clocking signal and output therefrom multiple successive reset pulse signals based upon a programmed frequency division, and
  refresh control logic connected to the programmable non-volatile frequency divider for receiving the multiple successive reset pulse signals output therefrom, said refresh control logic responding to each reset pulse signal by refreshing a portion of the memory array, wherein output of said multiple successive reset pulse signals from the programmable non-volatile frequency divider defines a refresh rate at which the memory array is refreshed as an interval of time between any two successive reset pulse signals of the multiple successive reset pulse signals, said refresh control logic further including means for disabling refreshing of the memory array for a programmable "wait state interval" subsequent to said refresh control logic receiving from a control system connected to the semiconductor memory device a signal initiating self-refresh, and means for enabling refreshing of the memory array subsequent to said wait state interval.

7. The memory system of claim 6, wherein said memory system comprises a semiconductor memory chip.

8. A programmable refresh circuit integrated with a semiconductor memory device having a memory array accessed through word lines and bit lines, said programmable refresh circuit comprising:
 a self-timed oscillator that outputs a clocking signal;
 programmable pattern generating means for generating a first signal pattern;
 counter means connected to receive the clocking signal output from the self-timed oscillator and the first signal pattern generated by the programmable pattern generating means, said counter means having a count driven by said clocking signal and outputting a signal pulse upon the count reaching a digital pattern representation corresponding to the first signal pattern generated by the programmable pattern generating means, said counter means including a counter containing the count and a refresh rate comparing means coupled thereto, said counter receiving the clocking signal output from the self-timed oscillator, said refresh rate comparing means comprising means for comparing the count of the counter with the first signal pattern generated by the programmable pattern generating means and for outputting the signal pulse when the digital pattern representation of the count corresponds to the first signal pattern generated by the programmable pattern generating means; and
 refresh control logic connected to said counter means for receiving the signal pulse output therefrom, said refresh control logic responding thereto by refreshing a portion of the memory array of the semiconductor memory device, wherein output of multiple signal pulses from the counter means defines a refresh rate at which the memory array is refreshed.

9. The programmable refresh circuit of claim 8, further comprising means for resetting said counter means upon output of the signal pulse to the refresh control logic.

10. The programmable refresh circuit of claim 8, wherein the self-timed oscillator outputs two non-overlapping clocking signals to the counter means, and wherein the count of the counter means is driven by both of said two non-overlapping clocking signals.

11. The programmable refresh circuit of claim 10, wherein the counter means includes a divide by N counter connected to receive the two non-overlapping clock signals output from the self-timed oscillator, wherein N is an integer.

12. A programmable refresh circuit integrated with a semiconductor memory device having a memory array accessed through word lines and bit lines, said semiconductor memory device further including a row address strobe (RAS) clock generator and a column address strobe (CAS) clock generator, said RAS clock generator having a RAS buffer coupled to receive a RAS signal from an external control system connected to the semiconductor memory device and said CAS clock generator having a CAS buffer connected to receive a CAS signal from the external control system connected to the semiconductor memory device, said programmable refresh circuit being coupled to the RAS buffer and to the CAS buffer, said programmable refresh circuit comprising:
 a self-timed oscillator that outputs a clocking signal;
 programmable pattern generating means for generating a first signal pattern;
 counter means connected to receive the clocking signal output from the self-timed oscillator and the first signal pattern generated by the programmable pattern generating means, said counter means having a count driven by said clocking signal and outputting a signal pulse upon the count reaching a digital pattern representation corresponding to the first signal pattern generated by said programmable pattern generating means; and
 refresh control logic connected to said counter means for receiving the signal pulse output therefrom, said refresh control logic responding thereto by refreshing a portion of the memory array of the semiconductor memory device, wherein output of multiple signal pulses from the counter means defines a refresh rate at which the memory array is refreshed, said refresh control logic further including means for controlling the RAS buffer and the CAS buffer to ignore a RAS signal and CAS signal input thereto, respectively, during self-refreshing of a portion of the memory array of the semiconductor memory device.

13. A memory system comprising:

a memory device including a memory array accessed through word lines and bit lines; and a refresh circuit integrated with a memory array, said refresh circuit including:

a self-timed oscillator that outputs a clocking signal, programmable pattern generating means for generating a first signal pattern, counter means connected to receive the clocking signal output from the self-timed oscillator and the first signal pattern generated by the programmable pattern generating means, said counter means having a count driven by said clocking signal and outputting a signal pulse upon the count reaching a digital pattern representation corresponding to the first signal pattern generated by the programmable pattern generating means, said counter means including a counter containing the count and a refresh rate comparing means coupled thereto, said counter receiving the clocking signal output from the self-timed oscillator, said refresh rate comparing means comprising means for comparing the count of the counter with the first signal pattern generated by the programmable pattern generating means and for outputting the signal pulse when the digital pattern representation of the count corresponds to the first signal pattern generated by the programmable pattern generating means, and refresh control logic connected to said counter means for receiving the signal pulse output therefrom, said refresh control logic responding thereto by refreshing a portion of the memory array of the memory device, wherein output of multiple signal pulses from the counter means defines a refresh rate at which the memory array is refreshed.

14. A memory system comprising:

a memory device including a memory array accessed through word lines and bit lines, said memory device further including a row address strobe (RAS) clock generator and a column address strobe (CAS) clock generator, said RAS clock generator having a RAS buffer coupled to receive a RAS signal from an external control system connected to the memory device and said CAS clock generator having a CAS buffer connected to receive a CAS signal from the external control system connected to the memory device; and a refresh circuit integrated with the memory device, said refresh circuit including a self-timed oscillator that outputs a clocking signal, programmable pattern generating means for generating a first signal pattern, counter means connected to receive the clocking signal output from the self-timed oscillator and the first signal pattern generated by the programmable pattern generating means, said counter means having a count driven by said clocking signal and outputting a signal pulse upon the count reaching a digital pattern representation corresponding to the first signal pattern generated by the programmable pattern generating means, and refresh control logic connected to said counter means for receiving the signal pulse output therefrom, said refresh control logic responding thereto by refreshing a portion of the memory array of the semiconductor memory device, wherein output of multiple signal pulses from the counter means defines a refresh rate at which the memory array is refreshed, said refresh control logic further including means for controlling the RAS buffer and the CAS buffer to ignore a RAS signal and a CAS signal input thereto, respectively, during self-refreshing of a portion of the memory array of the memory device.

* * * * *

UNITED STATES PATENT AND TRADEMARK OFFICE
CERTIFICATE OF CORRECTION

PATENT NO.  : 5,446,695
DATED       : August 29, 1995
INVENTOR(S) : Douse et al.

It is certified that error appears in the above-indentified patent and that said Letters Patent is hereby corrected as shown below:

Column 4, line 51, delete "(RE)" and substitute therefor --($\overline{RE}$)--.
Column 4, line 53, delete "(CE)" and substitute therefor --($\overline{CE}$)--.
Column 4, line 68, delete "(OE)" and substitute therefor --($\overline{OE}$)--.
Column 5, line  4, delete "(WE)" and substitute therefor --($\overline{WE}$)--.
Column 5, line  5, delete "(CE)" and substitute therefor --($\overline{CE}$)--.
Column 5, line 43, delete "(CE)" and substitute therefor --($\overline{CE}$)--.
Column 5, line 44, delete "(RE)" and substitute therefor --($\overline{RE}$)--.

Signed and Sealed this

Twenty-eighth Day of May, 1996

*Attest:*

BRUCE LEHMAN

*Attesting Officer*       Commissioner of Patents and Trademarks